PULSE PEAK TIME DETECTING CIRCUIT

Filed Jan. 24, 1966

INVENTOR.
KENNETH J. SCHLICHTING,
BY Paul M. Coble
ATTORNEY 3,422,285

PULSE PEAK TIME DETECTING CIRCUIT

Kenneth J. Schlichting, Sylmar, Calif., assignor to Hughes Aircraft Company, Culver City, Calif., a corporation of Delaware Filed Jan. 24, 1966, Ser. No. 522,717
U.S. Cl. 307—235 5 Claims
Int. Cl. H03k 5/20

ABSTRACT OF THE DISCLOSURE

The disclosed pulse peak time detecting circuit includes a transistor connected in a common emitter configuration and a differentiator circuit directly connected to the base electrode of the transistor for differentiating an input pulse applied to a terminal of the differentiator circuit electrically remote from the base electrode of the transistor. The transistor is biased by means of a power supply and a series resistor and diode to maintain the transistor nonconductive of current until the output signal from the differentiator circuit reaches a predetermined level.

This invention relates to electronic time detecting circuitry, and more particularly relates to circuits for detecting the time of occurrence of the maximum amplitude, or peak, of an input signal.

In numerous pulse circuit applications such as digital computer memory read-out, television transmission link signal testing, and control systems employing pulse-position modulation, for example, it is necessary to have an accurate indication of the point in time at which the pulse peak occurs. A prior art circuit for providing such pulse peak time information is described in U.S. Patent 3,048,717 to R. H. Jenkins. In this circuit the input pulse, the peak time of which is to be detected, is applied to a differentiating capacitor which is connected to the emitter electrode of a first voltage amplifying transistor connected in common base configuration. A diode is connected between the emitter and base electrodes of the first transistor to limit the negative excursions of the differentiated waveform, while an emitter follower transistor is connected to the collector electrode to limit the positive excursions of the differentiated waveform and prevent the first transistor from conducting to saturation. The output from the emitter follower transistor is in turn connected to a further differentiator which differentiates the emitter follower transistor output waveform to provide positive spike voltages essentially coincident in time with the onset and the termination of the original input pulse and a negative spike voltage essentially coincident with the peak of the original input pulse. The output from the further differentiator is fed to a threshold amplifier transistor which clips the positive spike voltages and shapes the negative spike voltages into an output signal indicative of the time of occurrence of the peak of the original input pulse.

Since the first transistor in the prior art circuit described above functions merely as a voltage amplifier, it will be apparent that considerable additional circuitry including a further differentiator and an additional transistor or diode clipper must be employed in order to derive the pulse peak time information from the output signal from the first transistor. Moreover, since the first transistor is maintained conductive during both quiescent and pulsed conditions, its input impedance affects the time constant of the input pulse differentiating circuitry. Therefore, in order to accommodate a wide variety of input pulse durations, the time constant of the input differentiator would have to be varied by adjusting the capacitance of the differentiating capacitor. However, since the first transistor is connected in the common base configuration, its input impedance assumes a relatively low value of around 50 ohms; hence, for pulse durations as great as 100 milliseconds, the required capacitance would be impractically large.

Accordingly, it is an object of the present invention to provide a circuit for detecting the time of occurrence of the maximum amplitude of an input signal, and which circuit is considerably simpler and requires fewer components than the prior art.

It is a further object of the present invention to provide a pulse peak time detecting circuit which can readily and accurately determine the time of occurrence of the peak amplitude of an input pulse for a wide variety of input pulse durations including but not being limited to pulse durations of the order of 100 milliseconds or longer.

It is a still further object of the present invention to provide a pulse peak time detecting circuit the operation of which is substantially unaffected by temperature changes throughout a temperature range extending from at least −65° F. to at least +165° F.

It is still another object of the present invention to provide a pulse peak time detector which requires only a single differentiator and a single transistor.

In accordance with the foregoing objects, the pulse peak time detecting circuit of the present invention includes a transistor and a differentiator having an output directly connected to the base electrode of the transistor. An input pulse, the time of occurrence of the maximum amplitude of which is to be detected, is applied to the differentiator. The transistor is maintained nonconductive of current until the output signal from the differentiator reaches a predetermined level, which occurs approximately at the time when the input pulse reaches its maximum ampltiude, at which time the transistor is rendered conductive and an output pulse is provided.

Additional objects, advantages, and characteristic features of the present invention will be become readily apparent from the following detailed description of preferred embodiments of the invention when considered in conjunction with the accompanying drawing in which.

Figure 1:
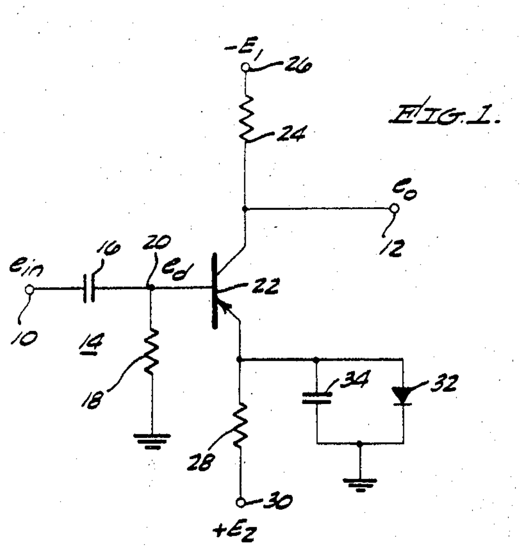
FIG. 1 is a schematic circuit diagram illustrating one embodiment of a pulse peak time detecting circuit according to the present invention.

Referring with greater particularity to FIG. 1, a pulse peak time detecting circuit according to the invention may be seen to include an input terminal 10 adapted to receive an input pulse $e_{in}$, the time of occurrence of the maximum amplitude of which is to be indicated by the commencement of an output pulse $e_o$ at output terminal 12. The input pulse $e_{in}$ is applied to a differentiating network 14 which comprises a capacitor 16 and a resistor 18 connected in series between the input terminal 10 and a level of reference potential designated as ground. The differentiated output voltage $e_d$ from the network 14 appears at a junction point 20 between capacitor 16 and resistor 18. The junction point 20 is connected directly to the base electrode of a switching transistor 22 connected in a common emitter configuration. Specifically, the collector of the transistor 22 is connected via a load resistor 24 to a power supply terminal 26 furnishing a potential designated as $-E_1$, while the emitter electrode of the transistor 22 is connected through a bias resistor 28 to a power supply terminal 30 providing a voltage designated $+E_2$. A diode 32, having a highly predictable substantially constant forward voltage drop, and a bypass capacitor 34 are connected in parallel between the emitter electrode of transistor 22 and the ground level.

It is pointed out that the specific circuit shown in FIG. 1 is designed for operation with positive input pulses, and accordingly, employs a PNP transistor as well as the particular bias potential and diode polarities illustrated in FIG. 1. Nevertheless, the circuit is equally suitable for operation with negative input pulses, in which case an NPN transistor would be used, and the bias potential and diode polarities would be reversed from those shown in FIG. 1.

The operation of the pulse peak time detector of FIG. 1 will now be described with reference to the waveforms illustrated in FIG. 3. Under quiescent conditions, i.e. in the absence of an input pulse $e_{in}$, the transistor 22 is just barely biased to a non-conductive condition. This condition results from the fact that the emitter electrode of the transistor 22 resides at a potential with respect to ground equal to the forward voltage drop across the diode 32, and transistor 22 and diode 32 are selected such that the emitter-base forward voltage drop required for conduction of the transistor is slightly greater than the forward voltage drop of the diode 32. As long as the transistor 22 remains non-conductive, the output voltage $e_o$ at the terminal 12 assumes a level of essentially $-E_1$ volts.

Figure 3:
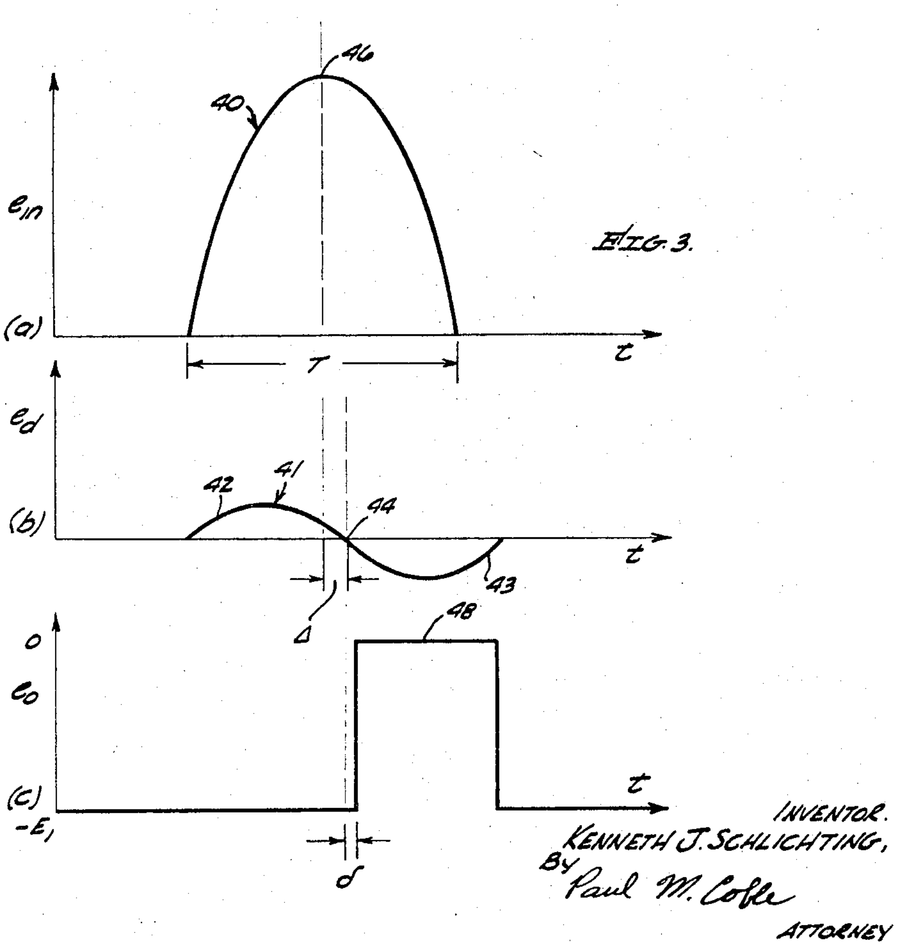
FIGS. 3(*a*)–(*c*) are graphs illustrating the voltage as a function of time at various points in the circuit of FIG. 1.

When an input voltage $e_{in}$, illustrated by the waveform 40 of FIG. 3(*a*), is applied to the input terminal 10, it is differentiated by the RC differentiating network 14 to provide at the terminal 20 the differentiated voltage $e_d$ illustrated by the waveform 41 of FIG. 3(*b*). The waveform 41 has a first portion 42 of positive polarity followed by a second portion 43 of negative polarity. The negative portion 43 commences at a point 44 which corresponds to the peak 46 of the input waveform 40 except for a time delay $\Delta$ between the time of occurrence of the pulse peak 46 and the time when the differentiated waveform 41 passes through the zero level. This time delay $\Delta$ is given by $$\Delta=\frac{(90^\circ-\theta)T}{360^\circ} \qquad (1)$$

where T is the duration of the input pulse 40 and $\theta$ is the phase shift of the differentiated voltage $e_d$ relative to the input voltage $e_{in}$. The phase shift $\theta$ may be determined according to the relation $$\tan\theta=\frac{1}{\omega RC} \qquad (2)$$

where $$\omega=\frac{2\pi}{T}$$

C represents the capacitance of capacitor 16, and R represents the resistance of resistor 18.

It is pointed out that the input voltage also undergoes some attenuation when passing through the differentiating network 14. For example, for an input pulse having a sinusoidal waveform, the maximum amplitude $E_d$ of the differentiated waveform will be given by $$E_d=\frac{E_{in}R}{\sqrt{R^2+\frac{1}{\omega^2C^2}}}\sin(\omega t+\theta) \qquad (3)$$

where $E_{in}$ is the maximum amplitude of the input pulse and R, C, $\omega$, and $\theta$ are as described above.

When the differentiated waveform 41 becomes negative, additional forward bias is applied across the emitter-base junction of the transistor 22, and after a short time delay $\delta$ following the time of occurrence of the point 44 of the waveform 41, the transistor 22 becomes conductive, rapidly reaching a condition of saturation. The resultant current flow through the load resistor 24 causes the output terminal 12 to reside at essentially ground potential and thereby provide an output pulse $e_o$, illustrated by the waveform 48 of FIG. 3(*c*), at the terminal 12. The output pulse 48 continues until the differentiated waveform 41 returns to a level of essentially zero volts, at which time the transistor 22 is again biased to a non-conductive condition.

It will be apparent that the output pulse 48 commences at the time when the peak 46 of the input pulse 40 occurs, except for the delay $\Delta$ introduced by the differentiating network 14 and the smaller delay $\delta$ due to turn-on of the transistor 22. It may be seen from Equation 2, however, that if circuit parameters are selected such that $\omega RC=0.1$, the differentiation phase shift $\delta$ becomes 84.3°. The resulting error in the pulse peak time indication would then be less than 2%. In any event, the effect of the time delay $\Delta$ may be minimized by introducing a corresponding time delay into the system utilizing the pulse peak time information.

In order to further described a specific circuit which may be constructed in accordance with the principles of the invention, the following exemplary circuit components and parameter values are set forth. It is to be understood, however, that this example is given solely for illustrative purposes and is in no way intended to limit either the circuit components or parameters. In accordance with the example, the circuit of FIG. 1 may employ a 2N1132 transistor for the transistor 22 and a G129 stabistor for the diode 32, along with the following circuit parameter values:

| | | |
|---|---|---|
| Capacitor **16** | $\mu$fd | 0.051 |
| Resistor **18** | | 2.4K |
| Resistor **24** | | 20K |
| Resistor **28** | | 100K |
| Capactior **34** | $\mu$fd | 47 |
| Capacitor $-E_1$ | volts | $-40$ |
| Capacitor $+E_2$ | volts | $+40$ |

Exemplary input pulses may have a peak amplitude varying from +2.5 to +40 volts, with a pulse duration T of around 2 milliseconds and a pulse repetition rate of 20 pulses per second. For the foregoing circuit and input pulse parameters, the resultant output pulse 48 at the terminal 12 would have an amplitude of 40 volts and a pulse duration of around 1 millisecond.

It will be apparent that the parameter values to be used in a specific circuit will depend on the amplitude, duration, and repetition rate of the input pulses. Nevertheless, certain general design criteria may be helpful in determining specific values to be used in a given situation. For example, the resistance of load resistor 24 should be made sufficiently large to ensure a high gain, but it should not substantially exceed the input impedance of the circuitry to be driven by the output pulse $e_o$. The bypass capacitor 34 should provide a capacitance sufficiently large so as to provide an effective alternating current ground for the emitter electrode of the transistor 22. The resistance of resistor 28 should be selected such that (for the aforementioned exemplary transistor) the forward bias across the emitter-base junction of transistor 22 under quiescent conditions is around 0.025 volt less than that required for saturation of the transistor.

Figure 2:
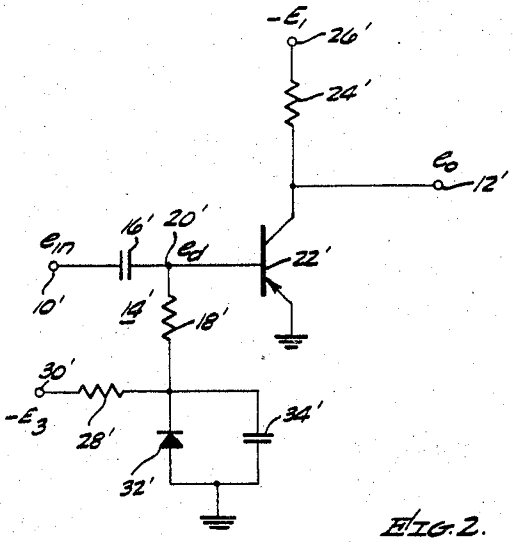
FIG. 2 is a schematic circuit diagram showing another embodiment of a pulse peak time detecting circuit according to the invention.

In order to minimize any changes in transistor bias due to changes in emitter current as a function of input pulse amplitude or repetition rate, the circuit shown in FIG. 2 may be employed instead of the circuit of FIG. 1. The circuit of FIG. 2 is quite similar to that of FIG. 1, and corresponding components in the circuit of FIG. 2 are designated by the same reference numerals as their counterpart components in FIG. 1 except for the addition of a prime designation. However, in the circuit of FIG. 2 the emitter electrode of transistor 22' is connected directly to ground, while the parallel biasing diode 32' and bypass capacitor 34' are connected to the base electrode of the transistor 22' via isolation resistor 18' which also forms part of the differentiating network 14'. The junction between resistor 18' and diode 32' is connected via bias resistor 28' to terminal 30' which provides a power supply voltage designated as $-E_3$.

Since in the circuit of FIG. 2 the biasing diode is located in the base circuit of the transistor rather than in the emitter circuit, changes in the diode current when the transistor changes its conductive condition (from cutoff to saturation) will be less by a factor equal to the transistor current gain $\beta$ than that for the circuit of FIG. 1. On the other hand, for the circuit of FIG. 2, in order to prevent the bias at the base electrode of transistor 22' from shifting significantly during discharge of the capacitor 16', the resistance of isolation resistor 18' must be kept small. Thus, for a given differentiator time constant, if the resistance of resistor 18' is reduced, the capacitance of capacitor 16' must be increased correspondingly.

It will be apparent that with pulse peak time detecting circuits according to the present invention, since the differentiator output is applied to a transistor which is quiescently biased to a non-conductive condition, the input impedance of the transistor does not affect the differentiator time constant. Therefore, the circuits of the present invention can readily and accurately determine the time of occurrence of pulse peaks having a wide variety of input pulse durations which may be as long as 100 milliseconds or longer. Also, since the transistor and diode are connected such that a change in the transistor emitter-base forward voltage drop as a function of temperature is compensated for by a similar change in the diode forward voltage drop, pulse peak time detectors according to the present invention are highly insensitive to temperature variations. In fact, a pulse peak time detecting circuit constructed according to FIG. 1 with the exemplary parameter values set forth above has been found to be substantially unaffected by temperature changes throughout a range extending from −65° F. to +165° F. Moreover, pulse peak time detectors according to the present invention are extremely simple in design, requiring only one transistor and one differentiator.

Although the present invention has been shown and described with reference to particular embodiments, nevertheless, various changes and modifications obvious to a person skilled in the art to which the invention pertains are deemed to lie within the purview of the invention.

What is claimed is:

1. A pulse peak time detecting circuit comprising: an input terminal, an output terminal, and a reference terminal; a transistor having an emitter electrode, a collector electrode, and a base electrode, said collector electrode being coupled to said output terminal; first and second power supply terminals; a first resistor coupled between said first power supply terminal and said collector electrode; a first capacitor coupled between said input terminal and said base electrode; and biasing circuit means coupled to said emitter electrode, said biasing circuit means including a second resistor and a diode coupled in series between said second power supply terminal and said reference terminal, and a second capacitor coupled in parallel with said diode, the junction between said second resistor and said diode being coupled to an electrode of said transistor.

2. A pulse peak time detecting circuit according to claim 1 wherein the junction between said second resistor and said diode is coupled to the emitter electrode of said transistor.

3. A pulse peak time detecting circuit according to claim 1 wherein the junction between said second resistor and said diode is resistively coupled to the base electrode of said transistor.

4. A pulse peak time detecting circuit comprising: an input terminal, an output terminal, and a reference terminal; a transistor having an emitter electrode, a collector electrode, and a base electrode, said collector electrode being connected to said output terminal; a differentiating circuit capacitor connected between said input terminal and said base electrode; a differentiating circuit resistor connected between said base electrode and said reference terminal; first and second power supply terminals; a load resistor connected between said first power supply terminal and said collector electrode; a bias resistor connected between said second power supply terminal and said emitter electrode; and a diode and a bypass capacitor connected in parallel between said emitter electrode and said reference terminal.

5. A pulse peak time detecting circuit comprising: an input terminal, an output terminal, and a reference terminal; a transistor having an emitter electrode, a collector electrode, and a base electrode, said collector electrode being connected to said output terminal and said emitter electrode being connected to said reference terminal; a differentiating circuit capacitor connected between said input terminal and said base electrode; first and second power supply terminals; a load resistor connected between said first power supply terminal and said collector electrode; an isolation resistor and a bias resistor connected in series between said base electrode and said second power supply terminal; and a diode and a bypass capacitor connected in parallel between said reference terminal and the junction between said isolation resistor and said bias resistor.

References Cited

UNITED STATES PATENTS

| | | | |
|---|---|---|---|
| 3,048,717 | 8/1962 | Jenkins | 328—150 |
| 3,073,968 | 1/1963 | Tribby | 307—235 |
| 3,248,560 | 4/1966 | Leonard | 328—150 |
| 3,293,451 | 12/1966 | Henning et al. | 307—318 |

FOREIGN PATENTS 1,011,459 Great Britain.

ARTHUR GAUSS, *Primary Examiner.*

B. P. DAVIS, *Assistant Examiner.*

U.S. Cl. X.R.

307—318; 328—150